(12) United States Patent
Barn et al.

(10) Patent No.: US 10,340,900 B2
(45) Date of Patent: Jul. 2, 2019

(54) SENSE AMPLIFIER FLIP-FLOP WITH EMBEDDED SCAN LOGIC AND LEVEL SHIFTING FUNCTIONALITY

(71) Applicant: Apple Inc., Cupertino, CA (US)

(72) Inventors: Amrinder S. Barn, San Jose, CA (US); Bo Zhao, Cupertino, CA (US); Michael A. Dreesen, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/389,332

(22) Filed: Dec. 22, 2016

(65) Prior Publication Data

US 2018/0181193 A1 Jun. 28, 2018

(51) Int. Cl.

| G11C 7/00 | (2006.01) |
|---|---|
| H03F 3/45 | (2006.01) |
| H03K 3/00 | (2006.01) |
| H03K 3/356 | (2006.01) |
| H03K 19/0175 | (2006.01) |
| G11C 29/32 | (2006.01) |
| G11C 7/10 | (2006.01) |

(52) U.S. Cl.
CPC ....... *H03K 3/356104* (2013.01); *G11C 29/32* (2013.01); *H03K 3/356121* (2013.01); *H03K 19/017509* (2013.01); *G11C 7/106* (2013.01); *G11C 2029/3202* (2013.01)

(58) Field of Classification Search
CPC ....... G06F 1/3296; G06F 1/324; G11C 7/106; H03K 19/017509; H03K 3/356104
See application file for complete search history.

(56) References Cited

U.S. PATENT DOCUMENTS

| 6,271,700 B1 * | 8/2001 | Itaya .............. G01R 31/318541 327/202 |
|---|---|---|
| 6,412,098 B1 * | 6/2002 | Jin .................... G01R 31/31725 716/106 |
| 6,788,105 B2 * | 9/2004 | Kono ............. G01R 31/318533 326/16 |
| 7,768,320 B1 * | 8/2010 | Yang ........................ G11C 7/02 327/215 |
| 8,045,401 B2 * | 10/2011 | Chong ................... G11C 29/32 365/189.05 |
| 8,553,482 B2 | 10/2013 | Chow |
| 8,930,862 B2 * | 1/2015 | Dally ................... H03K 19/096 327/107 |
| 9,666,302 B1 * | 5/2017 | Chang ...................... G11C 7/10 |

(Continued)

*Primary Examiner* — Kenneth B Wells
(74) *Attorney, Agent, or Firm* — Meyertons, Hood, Kivlin, Kowert & Goetzzel, P.C.

(57) ABSTRACT

In an embodiment, an apparatus includes a first latch including a true storage node and a complement storage node, a discharge circuit, and a second latch. The first latch may pre-charge the true storage node and the complement storage node to a first voltage level using a clock signal. The discharge circuit may, in response to a determination that a scan mode signal is asserted, selectively discharge either the true storage node or the complement storage node based on a value of a scan data signal, and otherwise may selectively discharge either the true storage node or the complement storage node based on a value of a data signal. The second latch may store a value of a data bit based on a voltage level of the true storage node and a voltage level of the complement storage node.

20 Claims, 7 Drawing Sheets

(56) References Cited

U.S. PATENT DOCUMENTS

2003/0226077 A1 12/2003 Zyuban
2006/0049852 A1* 3/2006 Park ...................... G11C 7/065
  327/55

* cited by examiner

SENSE AMPLIFIER FLIP-FLOP WITH EMBEDDED SCAN LOGIC AND LEVEL SHIFTING FUNCTIONALITY

BACKGROUND

Technical Field

Embodiments described herein are related to the field of integrated circuit implementation, and more particularly to data latching circuits.

Description of the Related Art

Some integrated circuits (IC), such as systems-on-chip (SOCs) for example, may include multiple flip-flop circuits. A flip-flop circuit (also referred to herein as "flip-flop" or simply "flop") refers to a circuit used to store a logical value of an input signal sampled at a particular point in time. Clocked flip-flops may be used to synchronize and control propagation of the input signal to an edge of a clock signal. For example, a flip-flop may latch a value of the input signal in response to a rising edge of the clock signal, the output of the flop determined by the latched value.

In some embodiments, the input signal may originate in a different voltage domain than the voltage domain that powers the flip-flop, thereby creating a voltage level mismatch at the input to the flop. To overcome this, an additional level shifting circuit may be used to generate an equivalent signal in the same voltage domain as the flip-flop.

Since flip-flops may be important to proper operation of an IC, effectively testing their functionality is desirable. Scan tests may be used to determine proper operation of at least a portion of flip-flops in an IC. To scan test a flip-flop, scan data, instead of normal input data, may be driven into an input of the flip-flop and the corresponding output data read and compared to an expected output.

SUMMARY OF THE EMBODIMENTS

Various embodiments of a processor are disclosed. Broadly speaking, a system, an apparatus, and a method are contemplated in which the apparatus includes a first latch circuit, including a true storage node and a complement storage node, a discharge circuit, and a second latch circuit coupled to the first latch circuit. The first latch circuit may be configured to pre-charge the true storage node and the complement storage node to a first voltage level using a clock signal. The discharge circuit may be configured to, in response to a determination that a scan mode signal is asserted, selectively discharge either the true storage node or the complement storage node based on a value of a scan data signal and in response to a first assertion of the clock signal, and to otherwise selectively discharge either the true storage node or the complement storage node based on a value of a data signal and in response to a second assertion of the clock signal. The scan data signal and the data signal may transition between a ground voltage level and a second voltage level, different than the first voltage level. The second latch circuit may be configured to store a value of a data bit based on a voltage level of the true storage node and a voltage level of the complement storage node.

In a further embodiment, to selectively discharge either the true storage node or the complement storage node based on the value of the data signal and in response to the second assertion of the clock signal, the discharge circuit may be further configured to discharge the complement storage node in response to a logic high value on the data signal, and to otherwise discharge the true storage node. In another embodiment, to selectively discharge either the true storage node or the complement storage node based on the value of the scan data signal and in response to the first assertion of the clock signal, the discharge circuit may be further configured to discharge the complement storage node in response to a logic high value on the scan data signal, and to otherwise discharge the true storage node.

In one embodiment, to pre-charge the true storage node and the complement storage node to the first voltage level using the clock signal, the first latch circuit may be further configured to pre-charge the true storage node and the complement storage node in response to a logic low value on the clock signal. In another embodiment, the discharge circuit may include a first discharge path including a first plurality of metal-oxide semiconductor field-effect transistors (MOSFETs), and a second discharge path including a second plurality of MOSFETs. Each of the first discharge path and the second discharge path may be coupled between the true storage node and a virtual ground. The first discharge path may be configured to discharge the true storage node based on the scan mode signal and the scan data signal. The second discharge path may be configured to discharge the true storage node based on an inverse scan mode signal and the input data signal.

In one embodiment, the discharge circuit may include a third discharge path including a third plurality of MOSFETs, and a fourth discharge path including a fourth plurality of MOSFETs, each coupled between the complement storage node and the virtual ground. The third discharge path may be configured to discharge the complement storage node based on the scan mode signal and an inverse scan data signal, and wherein second discharge path may be configured to discharge the complement storage node based on the inverse scan mode signal and an inverse input data signal. In a further embodiment, the virtual ground may be discharged to a ground reference signal in response to a logic high value on the clock signal.

BRIEF DESCRIPTION OF THE DRAWINGS

The following detailed description makes reference to the accompanying drawings, which are now briefly described.

Figure 1:
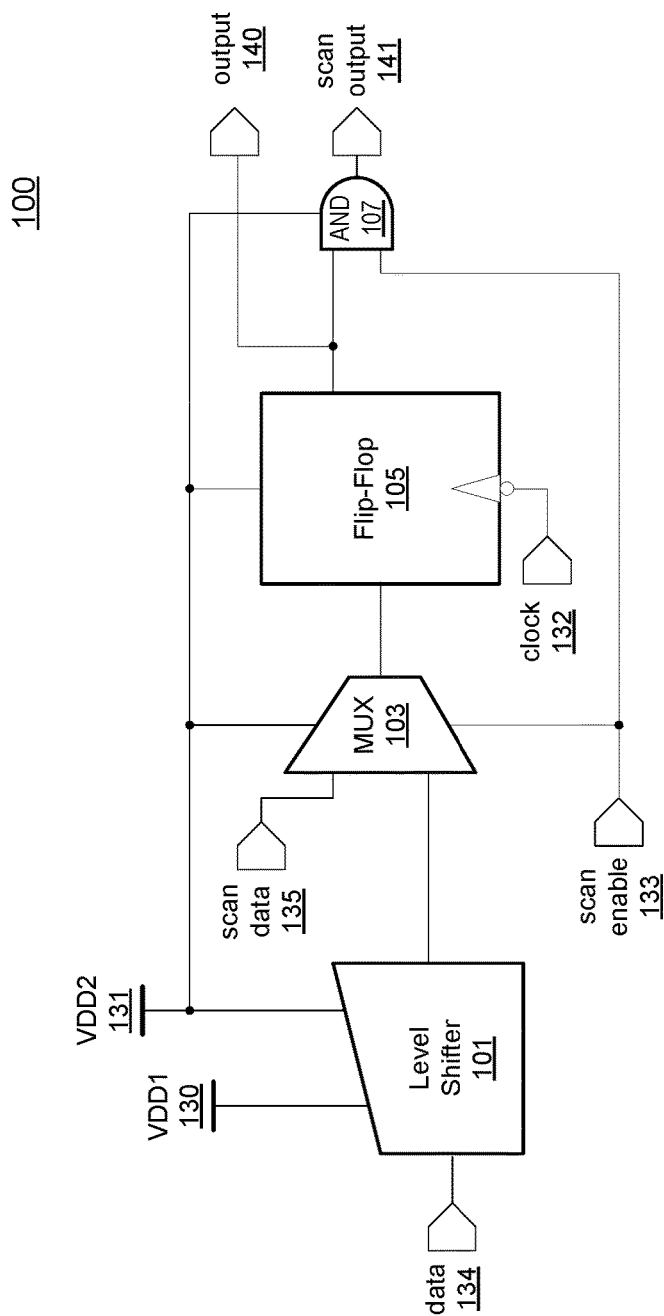
FIG. 1 depicts a block diagram of an embodiment of a circuit for latching a data signal across voltage domains.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

Flip-flop circuits may be used in a variety of integrated circuit (IC) designs, including, for example, systems-on-a-chip (SoCs), to store, at least temporarily a value or state of a signal. In some embodiments, flip-flops may be used to latch a state of an input signal that originates in a different voltage domain than the flop. Traditional designs may use a level shifting circuit to shift the signal into a same voltage domain as the flip-flop. As used herein, to "level shift" or simply "shift" a signal between voltage domains refers to a circuit receiving a logic signal generated in a first voltage domain where it may toggle between a ground reference signal a voltage level determined by a first power signal, and shifting or regenerating the logic signal into a second voltage domain in which it toggles between the ground reference signal and voltage level determined by a second power signal.

In some embodiments, the voltage level of the first power signal may be too low, compared to the voltage level of the second power signal, for circuits powered in the second voltage domain to reliably read a logic high level. The signal may be shifted up into the second voltage domain to increase the signal's voltage level, allowing the circuits of the second voltage domain to read the signal more reliably. On the contrary, in some embodiments, the voltage level of the first power signal may be too high for circuits in the second voltage domain to safely receive. The voltage level of the first power signal may be at risk of damaging the circuits of the second voltage domain. In such cases, the logic signal may be shifted down to the second voltage domain so the signal may be safely received by the circuits.

Testing of an IC may include scan tests for validating digital circuitry. To scan test an IC, various flip-flops in the IC are replaced with scan enabled flops, with two or more flops coupled serially to form a scan chain. In some embodiments, the IC may operate in a normal mode up to a known point, and then a scan test is enabled to validate that the circuits operated correctly to the known point. In other embodiments, scan may be enabled and scan data used as an input to initialize the scan chain to a known state and then returned to the normal operating mode and validated that the tested circuits operate properly from the initialized state. To implement scan test on a flip-flop, a scan test input may be multiplexed with a normal data input, thereby requiring additional circuits which may add cost, and may create timing issues by delaying the data input during normal operation.

Various embodiments of flip-flop circuits are disclosed herein. The disclosed embodiments demonstrate methods for latching a value of a logic signal that may originate in a different voltage domain than the power supply for the flip-flop circuit without a need for a level shifting circuit. Additionally, the disclosed embodiments demonstrate methods for multiplexing scan test signals into and out of the flip-flop circuit without a need for multiple multiplexing circuits. Elimination of level shifting and multiplexing circuits may reduce circuit size and may reduce propagation delays for the logic signal.

Many terms commonly used in reference to SoC designs are used in this disclosure. For the sake of clarity, the intended definitions of some of these terms, unless stated otherwise, are as follows.

A Metal-Oxide Semiconductor Field-Effect Transistor (MOSFET) describes a type of transconductive device that may be used in modern digital logic designs. MOSFETs are designed as one of two basic types, n-channel and p-channel. N-channel MOSFETs open a conductive path between the source and drain when a positive voltage greater than the device's threshold voltage is applied from the gate to the source. P-channel MOSFETs open a conductive path when a voltage greater than the device's threshold voltage is applied from the source to the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an n-channel device on, i.e., opens a conductive path, and turns a p-channel MOSFET off, i.e., closes a conductive path. Conversely, a low level on the gate of a MOSFET turns a p-channel on and an n-channel off. In addition, the term transconductance is used in parts of the disclosure. While CMOS logic is used in the examples, it is noted that any suitable digital logic process may be used for the circuits described in this disclosure.

It is noted that "high," "high level," and "high logic level" refer to a voltage sufficiently large to turn on a n-channel MOSFET and turn off a p-channel MOSFET while "low," "low level," and "low logic level" refer to a voltage that is sufficiently small enough to do the opposite. As used herein, a "logic signal" refers to a signal that transitions between a high logic level and a low logic level. In various other embodiments, different technology may result in different voltage levels for "low" and "high."

The embodiments illustrated and described herein may employ CMOS circuits. In various other embodiments, however, other suitable technologies may be employed.

A block diagram of an embodiment of a circuit for latching a data signal across voltage domains is illustrated in FIG. 1. In the illustrated embodiment, Circuit 100 includes Level Shifter 101, Multiplexing Circuit (MUX) 103, Flip-Flop 105, and Logic Gate (AND) 107. Circuit 100 receives clock signal 132, scan enable signal 133, data signal 134, and scan data signal 135. Circuit 100 also generates output signal 140 and scan output signal 141. Most of Circuit 100 is powered by power signal VDD2 131, while Level Shifter 101 also receives power signal VDD1 130. In various embodiments, Circuit 100 may be configured for use in a mobile computing application such as, e.g., a notebook computer, tablet computer, smartphone, or wearable device.

In the illustrated embodiment, Circuit 100 receives data signal 134, which is generated in the VDD1 130 voltage domain. Level Shifter 101 is used to shift data signal 134 into the VDD2 131 voltage domain. Level Shifter 101 generates a signal corresponding to data signal 134 in the VDD2 131 voltage domain, which is received by MUX 103, along with scan data signal 135. MUX 103 selects either scan data signal 135 or the level-shifted data signal 134 based on a state of scan enable signal 133. The selected output of MUX 103 is sent to Flip-Flop 105 where a value of the selected output is captured and stored in response to an active transition of clock signal 132. In the illustrated embodiment, a high-to-low transition latches the selected output value. In other embodiments, however, a low-to-high transition may be used instead.

Flip-Flop 105 generates output signal 140, corresponding to the currently latched value. Output signal 140 may be utilized by any suitable circuitry. In addition, output signal 140 is received by AND gate 107. AND gate 107 logically ANDs output signal 140 with scan enable signal 133 to create scan output signal 141, which may be sent to suitable scan test logic or a next device in a scan chain.

It is noted that the block diagram illustrated in FIG. 1 is merely an example. In other embodiments, different circuit blocks, and different configurations of circuit blocks may be possible dependent upon the specific application for which the corresponding circuit is intended.

Figure 2:
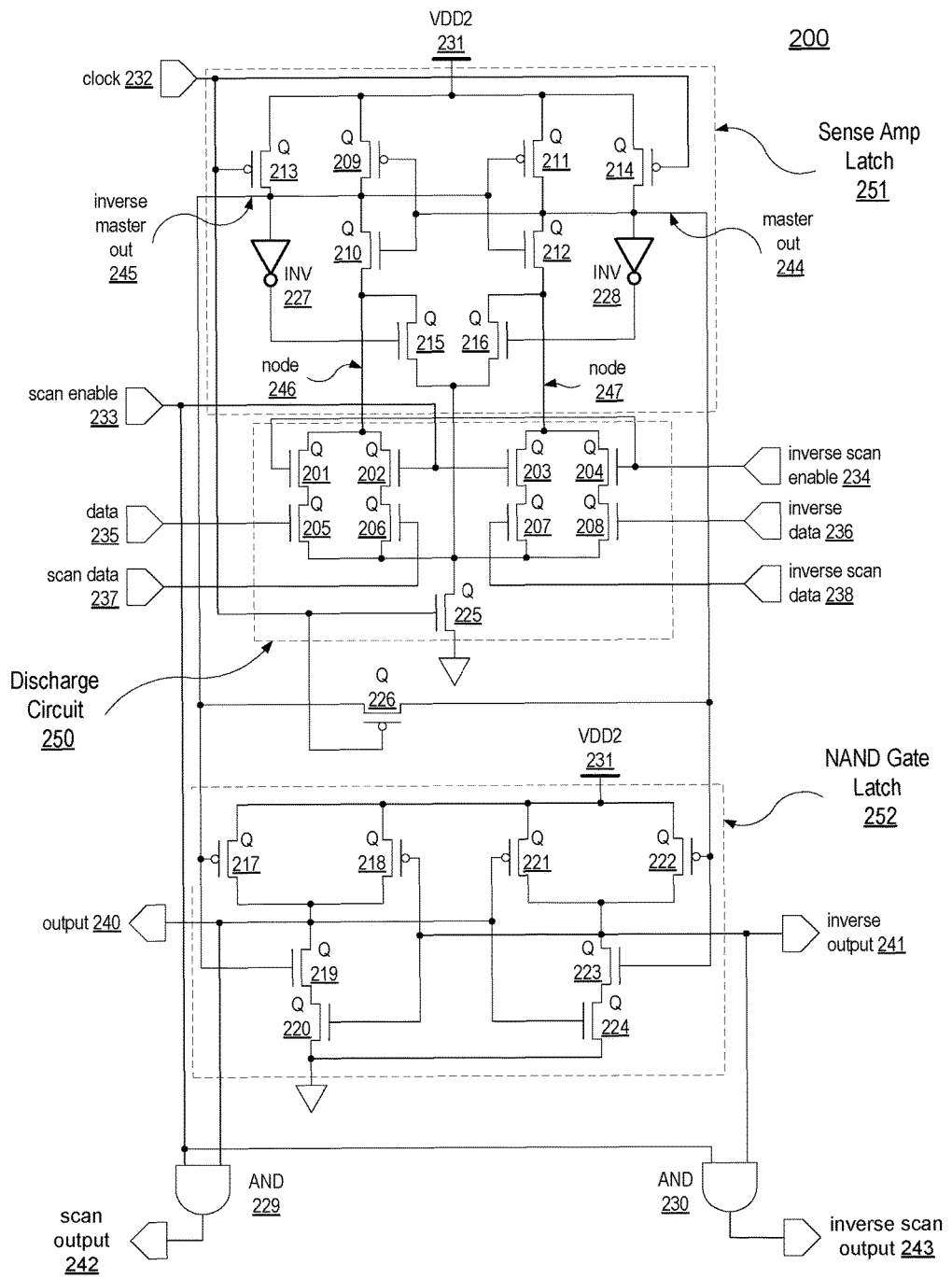
FIG. 2 illustrates a circuit diagram of an embodiment of a flip-flop circuit with level shifting and scan test capabilities.

Turning to FIG. 2, a circuit diagram of an embodiment of a flip-flop circuit with level shifting and scan test capabilities is illustrated. The embodiment of Flop Circuit 200 may be designed to perform functions similar to the circuit blocks shown in FIG. 1, including Level Shifter 101, MUX 103, Flip-Flop 105, and AND gate 107 using a single flip-flop circuit. Flop Circuit 200 includes three sub-circuits: Discharge Circuit 250, which includes transconductive devices Q 201 through Q 208 as well as Q 225; Sense Amplifier (Amp) Latch 251, which includes devices Q 209 through Q 216, and inverting circuits (INV) 227 and 228; and NAND Gate Latch 252, which includes devices Q 217 through Q 224. Additional circuit elements include device Q 226 and Logic Gates (AND) 229 and 230. In addition, Flop Circuit 200 receives input signals clock 232, scan enable 233, inverse scan enable 234, data 235, inverse data 236, scan data 237, and inverse scan data 238. Power is received from power signal VDD2 231. Flop Circuit 200 generates output signals output 240, inverse output 241, scan output 242, and inverse scan output 243.

In the illustrated embodiment, Discharge Circuit 250 includes two paths to discharge node 246 and two paths to discharge node 247. Flop Circuit 200 has two modes of operation, normal mode and scan test mode, selected by a state of scan enable 233. The four paths include a data path via devices Q 201 and Q 205, an inverse data path via devices Q 204 and Q 208, a scan data path via devices Q 202 and Q 206, and an inverse scan data path via devices Q 203 and Q 207. In each mode, two of the four paths are enabled, one coupled to each of nodes 246 and 247. In normal mode, scan enable 233 is de-asserted, i.e., has a logic low value, thereby disabling Q 202 and Q 203 (corresponding to the scan data path and the inverse scan data path), and enabling Q 201 and Q 204 (corresponding to the data path and the inverse data path). Input signals data 235 and inverse data 236, therefore, determine which of the two enabled paths actively discharges in response to a rising transition on clock 232. Input signals scan data 237, and inverse scan data 238, to the contrary, are ignored by Discharge Circuit 250 in the normal mode of operation.

Device Q 225 is used, in the illustrated embodiment, to generate a virtual ground reference signal for devices Q 205 through Q 208. As used herein, a "virtual ground reference," or simply "virtual ground," refers to a circuit node that is discharge, at certain times, to a ground reference by one or more transconductive devices. While clock 232 is low, Q 225 is off, thereby isolating devices Q 205 through Q 208 from the ground reference signal.

In the normal mode, Sense Amp Latch 251 latches a value of data 235 on master out node 244 and a value of inverse data 236 on inverse master out node 245 in the illustrated embodiment. Master out node 244 may also be referred to as a true storage node, while inverse master out node 245 may be referred to as a complement storage node. As used herein, a "true storage node" refers to a circuit node in which a value of a sampled signal is stored. A "complement storage node" refers to a circuit node in which an inverse or "complement" value of the same sampled signal is stored. Devices Q 213 and Q 214 are on while clock 232 is low, resulting in both master out node 244 and inverse master out node 245 being forced to high values. Q 226 is also on, thereby coupling master out node 244 to inverse master out node 245 and bringing the two nodes to a same logic high voltage level.

In NAND Latch Gate 252, the high voltage levels on master out node 244 and inverse master out node 245 cause Q 217 and Q 222, to both be disabled, and Q 219 and Q 223 to both be enabled. The states of Q 220 and Q 224 are determined by current values of output 240 and inverse output 241, one of which will be high and the other low. For example, a high value on output 240 results in Q 224 being enabled and causing inverse output 241 to be coupled to the ground reference signal, further pulling inverse output 241 to a logic low value. This low value disables Q 220, isolating output 240 from the ground reference signal, thereby allowing output 240 to remain at a high value. If the values of output 240 and inverse output 241 are reversed, then output 240 is further pulled to a low value and inverse output 241 is allowed to remain at a high value. In summary, the values of output 240 and inverse output 241 are latched and may not change in response to changes in the values of data 235 or inverse data 236 while clock 232 is low.

Output 240 is coupled to an input of AND gate 229, and inverse output 241 is coupled to an input of AND gate 230. Since scan enable 233 is low, however, the outputs of each AND gate, i.e., scan output 242 and inverse scan output 243 remain at a logic low value regardless of the values of output 240 and inverse output 241.

When clock 232 transitions from a low value to a high value, Q 213, Q 214, and Q 226 are disabled, and Q 225 is enabled. While Q 225 is enabled, the virtual ground is enabled and Q 205 through Q 208 now have a path to the ground reference signal. Values on master out node 244 and inverse master out node 245 are now determined based on the values of data 235 and inverse data 245. If data 235 is high and inverse data 236 is, therefore, low, then Q 205 is enabled and Q 208 is disabled. Q 201 and Q 205 now provide a path from node 246 to the ground reference signal, forcing node 246 to discharge to a low value. With Q 203 and Q 208 off, node 247 does not have a path to the ground reference signal and, therefore, remains high. The high level on master out node 244 combined with the low level on node 246 causes Q 210 to enable, which in turn causes inverse master out node 245 to be discharged to the same low level as node 246. The low level of inverse master out node 245 causes Q 211 to be enabled, further pulling master out node 244 to a high level. The high level of master out node 244 causes the output of INV 228 to be low, keeping Q 216 off. The low level of inverse master out node 245, however, causes the output of INV 227 to go high, turning Q 215 on and further discharging node 246, and therefore inverse master out node 245, to low levels.

In NAND Latch Gate 252, master out node 244 is coupled to the control terminals of Q 222 and Q 223, and inverse master out node 245 drives the control terminals of Q 217 and Q 219. The high level on master out node 244 and the low level on inverse master out node 245, therefore, results in Q 217 and Q 223 being enabled, while Q 219 and Q 222 are disabled. The on state of Q 217 couples output 240 to the voltage level of VDD2 231 forcing output 240 to a logic high value, which, in turn, enables Q 224. With both Q 223 and Q 224 enabled, inverse output 241 is coupled to the ground reference signal, thereby forcing inverse output 241 to a low value.

It is noted that if the values of data 235 and inverse data 236 are reversed then node 247 goes to a low value while node 246 is isolated from the ground reference signal. Master out node 244 will be forced to a low level while inverse master out node 245 is forced high. Output 240 will then be forced to a low value and inverse output 244 forced to a high value.

In scan test mode, scan enable 233 is asserted, i.e., has a high value, thereby enabling the scan data path and inverse scan data path, while disabling the data path and inverse data path. Scan data 237 and inverse scan data 238 are, therefore, determine the values latched in Sense Amp Latch 251.

When clock 232 is low, the operation of Flop Circuit 200 is similar to what was just described for normal mode. When clock 232 transitions to a high value, the values of node 246 and node 247 are now determined based on scan data 237 and inverse scan data 238, rather than data 235 and inverse data 236. Operation is otherwise as described above for normal mode. In addition, the high value of scan enable 233 allows AND gates 229 and 230 to pass the values of output 240 and inverse output 241 to scan output 242 and inverse scan output 243, respectively.

It is noted that, to improve clarity and to aid in demonstrating the disclosed concepts, the circuit diagram illustrated in FIG. 2 has been simplified. In other embodiments, different and/or additional circuit devices and different configurations of the circuit devices are possible and contemplated. The circuit diagram of FIG. 2 is not intended to represent physical locations of the circuit devices, but simply logical connections.

Figure 3:
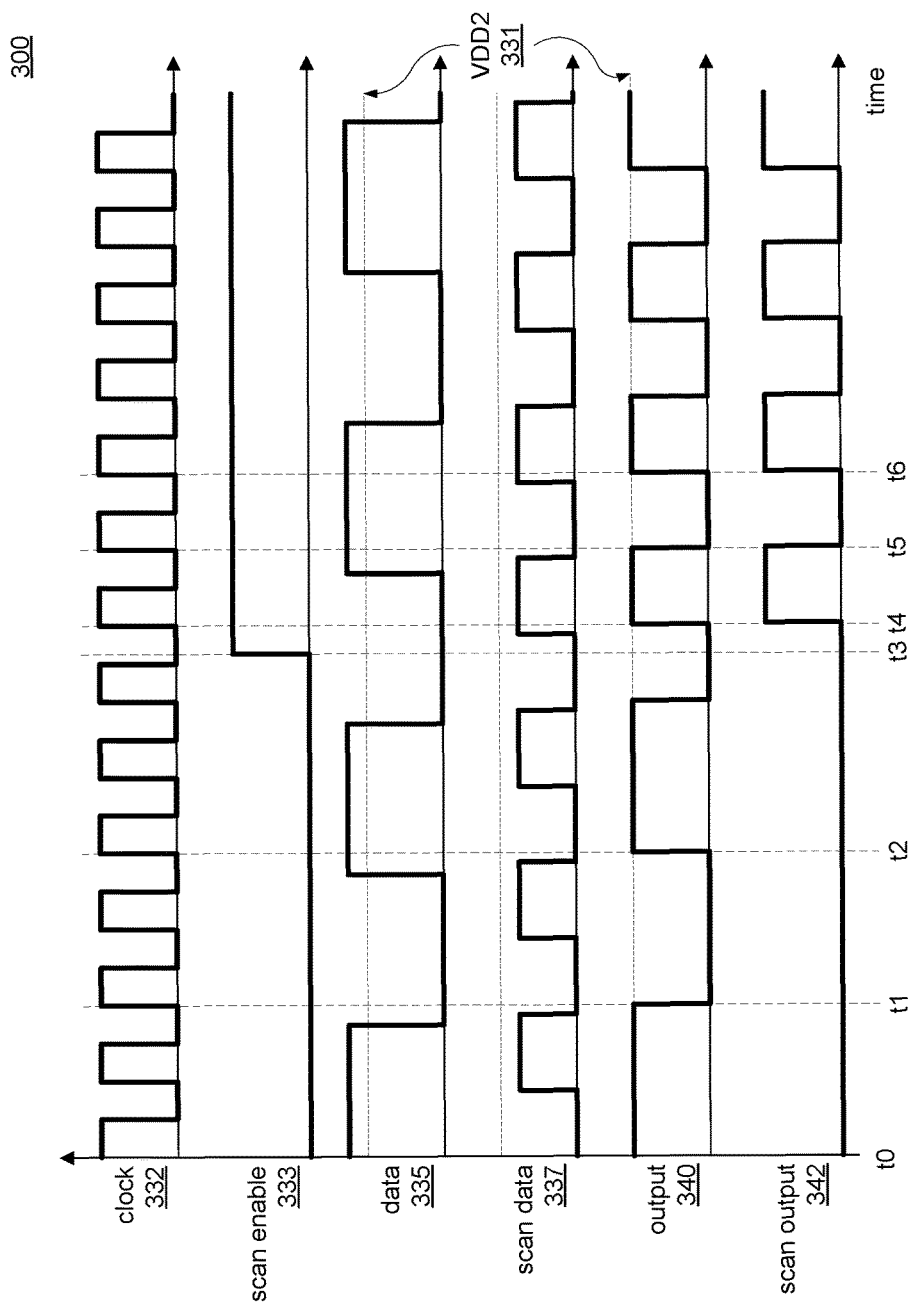
FIG. 3 depicts a chart of an embodiment of a timing diagram for a flip-flop circuit.

Moving to FIG. 3, a chart of an embodiment of a timing diagram for a flip-flop circuit is shown. In the illustrated embodiment, Chart 300 corresponds to an operation of a flip-flop circuit that includes scan and level shifting capabilities, such as, for example, Flop Circuit 200 in FIG. 2. Chart 300 includes six signals that correspond to the similarly named and numbered signals in FIG. 2: clock 332, data 335, scan data 337, scan enable 333, output 340, and scan output 342.

At time t0, scan enable is low, thereby selecting data 335 as the input to Flop Circuit 200 and forcing scan output 342 to a low value, regardless of the value of output 340. Clock 332 is high allowing a value of data 335 to determine a corresponding value of output 340, both of which are high at time t0. At the high-to-low transition on clock 332, between times t0 and t1, the value of data 335 is latched.

It is noted that a high voltage level of data 335 is higher than a voltage level of VDD2 331 that powers Flop Circuit 200. In contrast, a high voltage level of scan data 337 is lower than a voltage level of VDD2 331. The voltage levels of data 335 and scan data 337 are used to demonstrate level shifting capabilities of Flop Circuit 200. In other embodiments, the voltage levels of one or both signals may be the same as the level of VDD2 331.

At time t1, a low-to-high transition occurs on clock 332 after data 335 has transitioned to a low value. The low value of data 335 causes output 340 to transition low in response. At time t2, a low-to-high transition occurs on clock 332 after data 335 has transitioned to a high value. In response, output 340 transitions high.

Scan enable 333 transitions high at time t3, thereby enabling scan test mode for Flop Circuit 200. Scan data 337 is selected as the input and scan output 342 is enabled, allowing it to pass the value of output 340. Data 335 and scan data 337 are both low at this time, so neither output 340, nor scan output 342 change in response to scan test mode being enabled. At time t4, a rising edge on clock 332 occurs after scan data 337 has transitioned high. In response, both output 340 and scan output 342 transition high. Times t5 and t6 demonstrate further toggling of output 340 and scan output 342 in response to changes in scan data 337 and rising transitions of clock 332.

It is noted chart 300 illustrated in FIG. 3 is merely an example. The signals depicted in chart 300 are simplified for clarity. In other embodiments, signal waveforms may differ due to rise and fall times of the transconductive devices used or fabrication processes used to create them.

Figure 4:
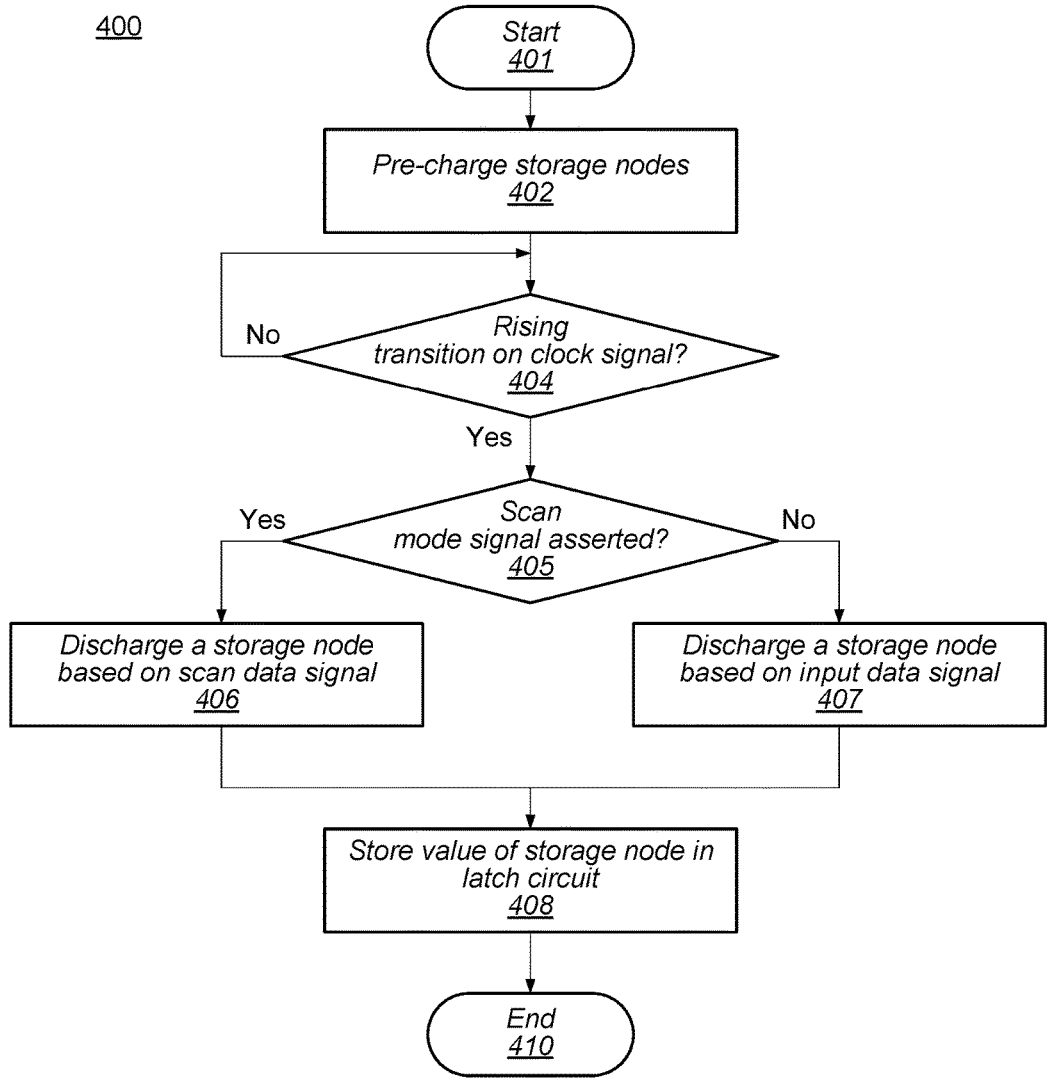
FIG. 4 shows a flow diagram of an embodiment of a method for operating a flip-flop circuit.

Turning now to FIG. 4, a flow diagram of an embodiment of a method for operating a flip-flop circuit is illustrated. Method 400 may be applied to a flip-flop circuit such as, for example, Flop Circuit 200. Referring collectively to the diagram of FIG. 4 and Flop Circuit 200, method 400 begins in block 401.

Two storage nodes are pre-charged (block 402). In the illustrated embodiment, a true storage node (master out node 244), and a complement storage node (inverse master out 245) are each pre-charged to logic high levels. The pre-charging occurs while a value of clock 232 is low. In other embodiments, the pre-charging may occur while clock 232 is high.

Further operations may depend on a transition of a clock signal (block 404). A value of clock 232 may determine if Flop Circuit 200 is in a capture state or a latched state. In the capture state, one of the active data paths (either data and inverse data paths, or scan data and inverse scan data paths) may discharge either master out node 244 or inverse master out 245. The logic levels of these two nodes are then passed on to output 240 and inverse output 241. In the latched state, output 240 and inverse output 241 hold their values regardless of transitions on the active input lines. In some embodiments, a low-to-high (i.e., rising) transition initiates the pass-through state, while a high-to-low (i.e., falling) transition enables the latched state. In other embodiments, the polarity of clock 232 may be reversed. If a rising transition on clock 232 is detected, then the method moves to block 405 to determine if a test mode signal is asserted. Otherwise, the method returns to block 402 to continue monitoring clock signal 232.

Subsequent operations of Method 400 may depend on a value of a test mode signal (block 405). In the illustrated embodiment, Flop Circuit 200 has two modes of operation, normal operating mode and scan test mode. When scan enable 233 is high and inverse scan enable 234 is low, Flop Circuit 200 is in scan test mode, and is otherwise in normal operating mode. In other embodiments, the polarity of scan enable 233 and inverse scan enable 234 may be reversed such that scan test mode is selected when scan enable 233 is low. In the current embodiment, if scan enable 233 is high, then the method moves to block 406 to discharge a storage node based on scan data 237. Otherwise, the method moves to block 407 to discharge a storage node based on data 235.

If Flop Circuit 200 is in scan test mode, then a storage node is selected and discharged based on a scan data signal (block 406). If scan enable 233 is high, then either master out node 244 or inverse master out node 245 is discharged based on the values of scan data 237 and inverse scan data 238. If scan data 237 is high, then inverse master out node 245 will be discharged, allowing master out node 244 to remain charged, corresponding to a high value. Otherwise, if inverse scan data 238 is high, then master out node 244 is discharged to a low value and inverse master out remains with a high value.

To the contrary, if Flop Circuit 200 is in normal operating mode, then a storage node is discharged based on an input data signal (block 407). If scan enable is low, then Flop Circuit 200 is in normal operating mode and either inverse master out node 245 or master out node 244, is discharged based on values of data 235 and inverse data 236.

Values of the storage nodes are stored in a latch circuit (block 408). In the illustrated embodiment, the values of master out node 244 and inverse master out node 245 are input into NAND Gate Latch 252. While clock 232 is high, NAND Gate Latch 252 responds to changes in the levels of master out node 244 and inverse master out node 245 by similarly changing values of output 240 and inverse output 241. A value of output 240 corresponds to the level of master out node 244 and a value of inverse output 241 corresponds to the level of inverse master out node 245. When clock 232 transitions low, the values of output 240 and inverse output 241 are latched. The method ends in block 410.

It is noted that the method illustrated in FIG. 4 is an example for demonstration purposes. In some embodiments, additional operations may be included. Additionally, operations may be performed in a different order in various embodiments.

Figure 5:
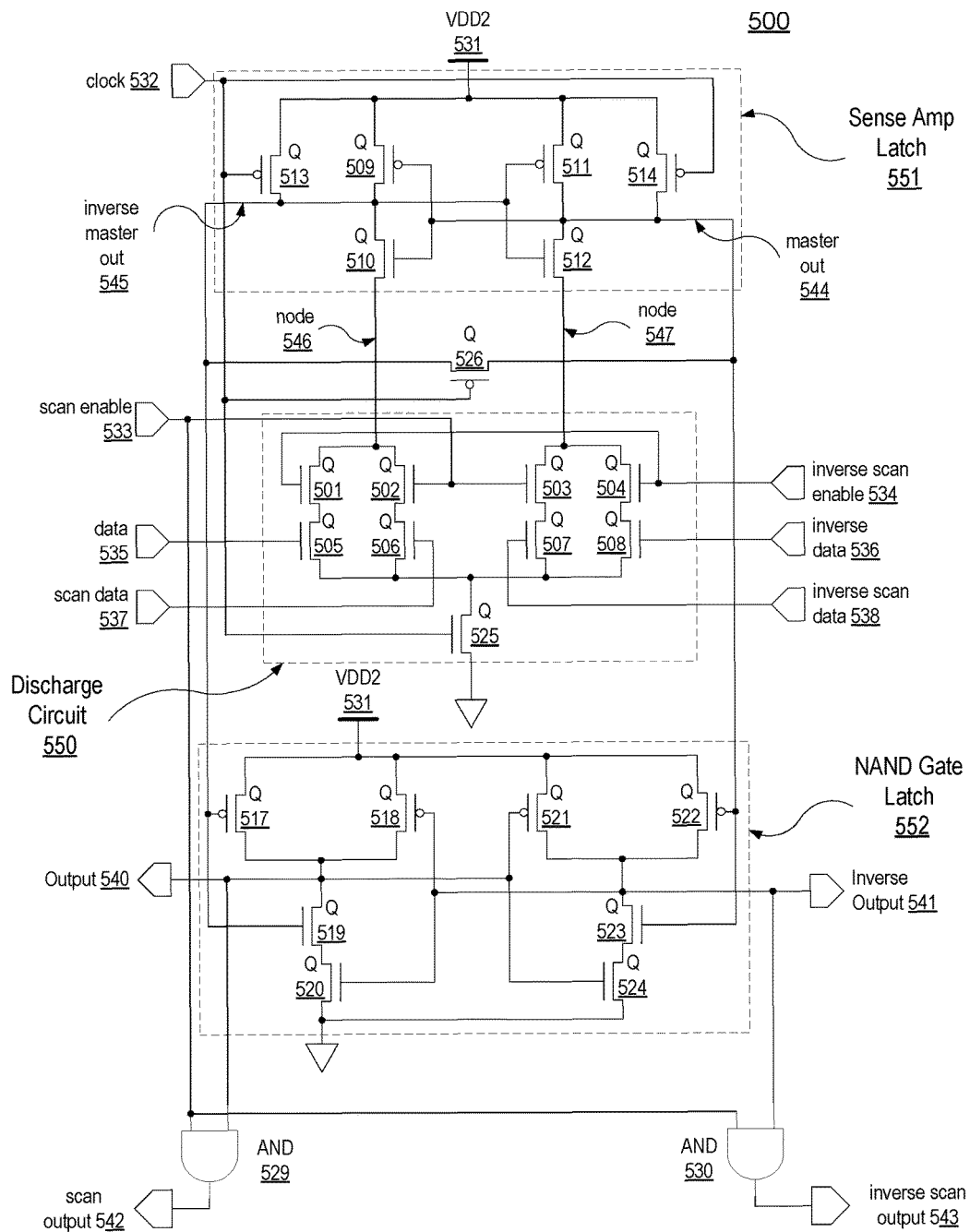
FIG. 5 illustrates a circuit diagram of another embodiment of a flip-flop circuit with level shifting and scan test capabilities.

Moving now to FIG. 5, a circuit diagram of another embodiment of a flip-flop circuit with level shifting and scan test capabilities is shown. Similar to Flop Circuit 200 in FIG. 2, the embodiment of Flop Circuit 500 may be designed to perform functions similar to the circuit blocks shown in FIG. 1. Flop Circuit 500 includes three sub-circuits: Discharge Circuit 550, which includes transconductive devices Q 501 through Q 508 as well as Q 525; Sense Amplifier (Amp) Latch 551, which includes devices Q 509 through Q 514; and NAND Gate Latch 552, which includes devices Q 517 through Q 524. Flop Circuit 500 also includes circuit elements Q 526 and Logic Gates (AND) 529 and 530. Flop Circuit 500 receives input signals clock 532, scan enable 533, inverse scan enable 534, data 535, inverse data 536, scan data 537, and inverse scan data 538. Power is received from power signal VDD2 531. Flop Circuit 500 generates output signals output 540, inverse output 541, scan output 542, and inverse scan output 543.

Functionality of Flop Circuit 500 is similar to the functionality of Flop Circuit 200, except as noted. Compared to Flop Circuit 200, Flop Circuit 500 does not include Inverting Circuits (INV) 227 and 228, nor does it include transconductive devices Q 215 and Q 216. Similar to Flop Circuit 200, scan enable 533 and inverse scan enable 534 are used to switch Flop Circuit 500 between a normal operating mode and a scan test mode. Additionally, voltage levels of input signals data 535, inverse data 536, scan data 537, and inverse scan data 538 may be different than a voltage level of VDD2 531, thereby providing Flop Circuit 500 with level shifting capabilities.

In contrast to Flop Circuit 200, the absence of INV 227, INV 228, Q 215, and Q 216 may reduce a size of Flop Circuit 500. In the current embodiment, however, the absence of INV 227, INV 228, Q 215, and Q 216 may increase a time for node 546 or node 547 to be discharged after a rising transition of clock 532. For example, if scan enable 533 is low, placing Flop Circuit 500 in the normal operating mode, and if data 535 has a high voltage level that is less than the voltage level VDD2 531, then Q 505 may not be fully turned on, thereby causing some resistance in the path to the ground reference signal. This additional resistance may slow the discharging of node 546 and inverse master out node 545 when compared to Flop Circuit 200. The additional circuit elements INV 227, INV 228, Q 215, and Q 216 may, therefore, increase an allowable voltage range of input signals data 535, inverse data 536, scan data 537, and inverse scan data 538.

It is noted that Flop Circuit 500 in FIG. 5 is merely an example. The illustrated embodiment has been simplified for clarity. In other embodiments, additional and/or different circuit devices may be included and configured differently.

Figure 6:
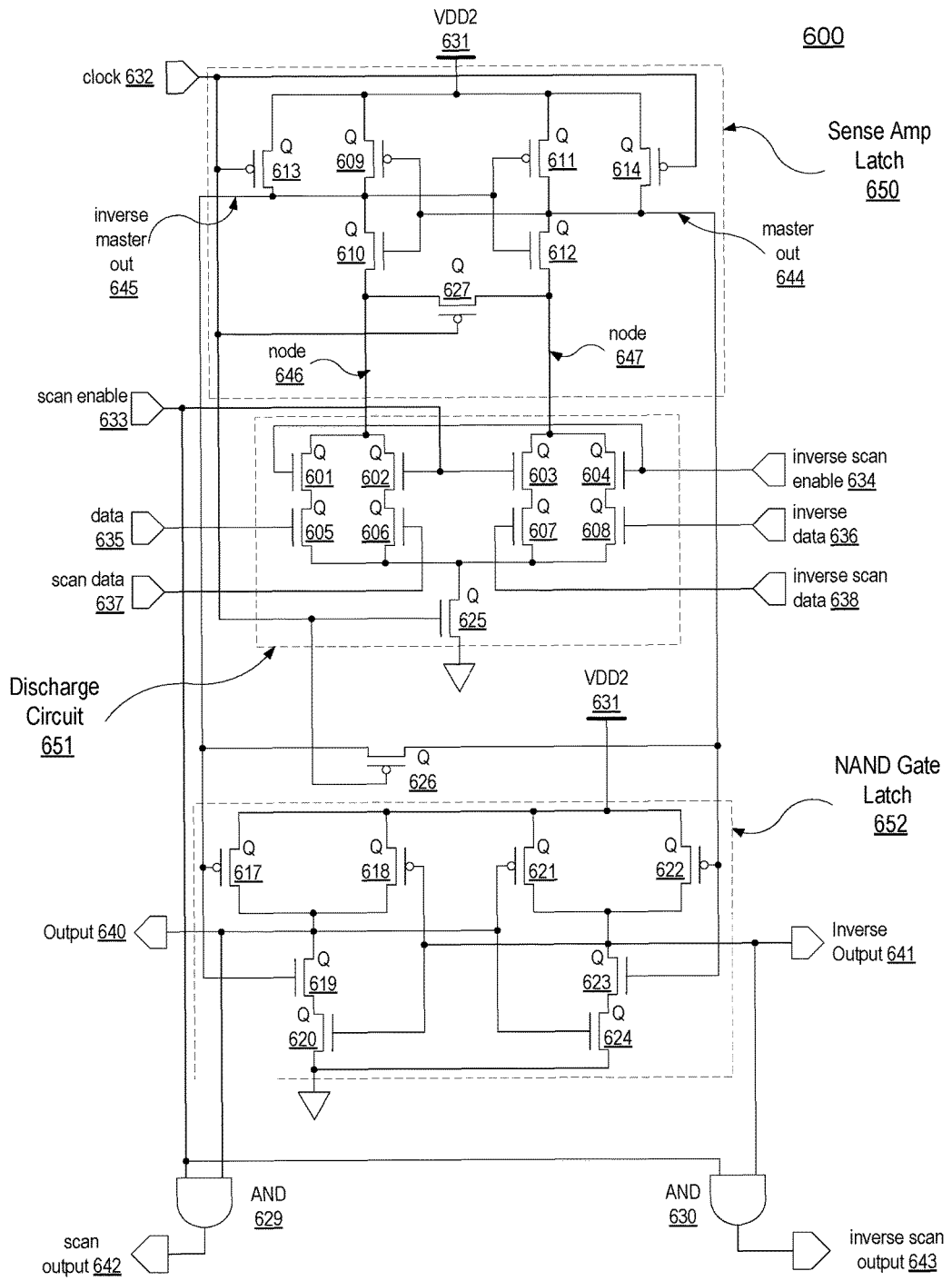
FIG. 6 depicts a circuit diagram of a third embodiment of a flip-flop circuit with level shifting and scan test capabilities.

Turning to FIG. 6, a circuit diagram of a third embodiment of a flip-flop circuit with level shifting and scan test capabilities is shown. Similar to Flop Circuits 200 and 500 in FIGS. 2 and 5, respectively, the embodiment of Flop Circuit 600 may be designed to perform functions similar to the embodiment of FIG. 1. In the illustrated embodiment, Flop Circuit 600 includes three sub-circuits: Discharge Circuit 650, which includes transconductive devices Q 601 through Q 608 as well as Q 625; Sense Amplifier (Amp) Latch 651, which includes devices Q 609 through Q 216, and Q 627; and NAND Gate Latch 652, which includes devices Q 617 through Q 624. Flop Circuit 600 further includes circuit elements Q 626, as well as Logic Gates (AND) 629 and 630. Flop Circuit 600 receives input signals clock 632, scan enable 633, inverse scan enable 634, data 635, inverse data 636, scan data 637, and inverse scan data 638. Power is received from power signal VDD2 631. Flop Circuit 600 generates output signals output 640, inverse output 641, scan output 642, and inverse scan output 643.

In the illustrated embodiment, the functionality of Flop Circuit 600 is similar to the functionality of Flop Circuit 500, except as noted. Compared to Flop Circuit 500, Flop Circuit 600 includes transconductive device Q 627. Similar to both Flop Circuits 200 and 500, scan enable 633 and inverse scan enable 634 are used to switch Flop Circuit 600 between a normal operating mode and a scan test mode. Additionally, voltage levels of input signals data 635, inverse data 636, scan data 637, and inverse scan data 638 may be different than a voltage level of VDD2 631, thereby providing Flop Circuit 600 with level shifting capabilities.

Transconductive device Q 627 is enabled when clock 632 is low. Node 646 and Node 647 are, therefore, pulled close to a same voltage level while clock 632 is low. This may balance the voltage levels of Nodes 646 and 647 prior to clock 632 transitioning high. As with Flop Circuits 200 and 500, either Node 646 is discharged low via the data path or the scan data path, or Node 647 is discharged low via the inverse data path or the inverse scan data path. Balancing the voltage levels of Nodes 646 and 647 may produce a more consistent discharging time for each of the nodes.

It is noted that, to improve clarity and to aid in demonstrating the disclosed concepts, the circuit diagram illustrated in FIG. 6 has been simplified. In other embodiments, different and/or additional circuit devices and different configurations of the circuit devices are possible and contemplated.

Figure 7:
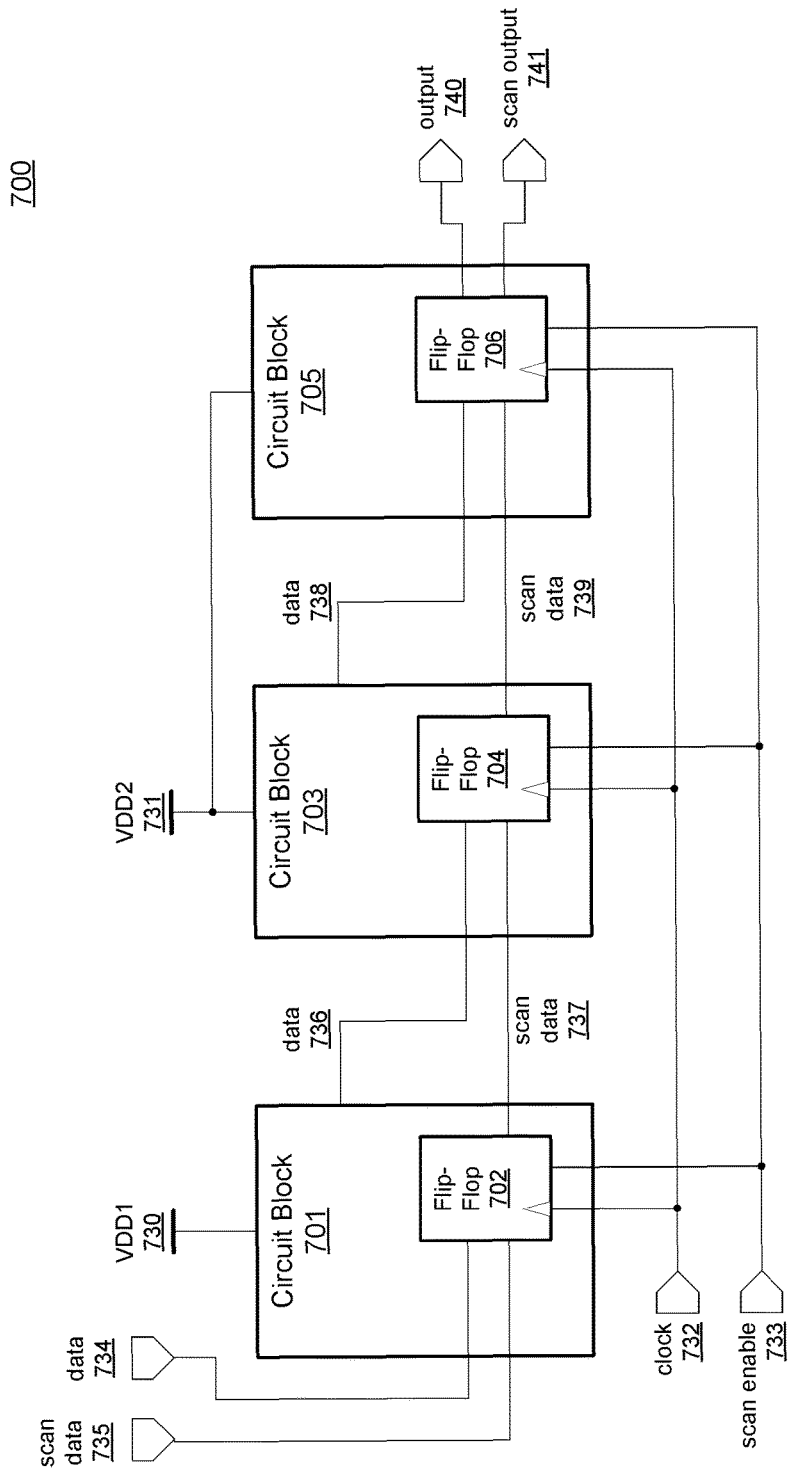
FIG. 7 depicts a block diagram of an embodiment of a circuit including various circuit blocks.

Turning to FIG. 7, a block diagram of an embodiment of a circuit including various circuit blocks is illustrated. The embodiment of Circuit 700 demonstrates one use of scan-enabled, level shifting flip-flops, such as, for example, any of Flop Circuit 200, Flop Circuit 500 or Flop Circuit 600. In the illustrated embodiment, therefore, Circuit 700 is designed to include scan test capabilities as well as signals that cross voltage domains. Circuit 700 includes Circuit Block 701, which includes Flip-Flop 702; Circuit Block 703, which includes Flip-Flop 704; and Circuit Block 705, which includes Flip-Flop 706. Flip-Flops 702, 704, and 706 may correspond to any of Flop Circuits 200, 500, or 600 as shown in FIGS. 2, 5, and 6, respectively. In addition, Circuit 700 receives input signals clock 732, scan enable 733, data 734 and scan data 735. Circuit Block 701 receives power from power signal VDD1 730. Circuit Blocks 703 and 705 receive power from power signal VDD2 231. Circuit Block 705 generates output signals output signal 740 and scan output signal 741.

In a normal operating mode, scan enable 733 is de-asserted and Circuit Block 701 receives clock 732 and data 734. Flip-Flops 702, 704, and 706 enable their respective data input paths and disable their respective scan data input paths. In the illustrated embodiment, a value of data 734 is latched in Flip-Flop 702 based on a transition of clock 732. In various embodiments, the value may be latched on a rising or falling transition of clock 732. Flip-Flop Circuit Block 701 generates output signal data 736. Data 736, in various embodiments, may be an output of Flip-Flop 702 or may be generated by other circuitry in Circuit Block 701. Additionally, since Circuit Block 701 receives power from VDD1 730, data 736 will transition between a ground reference signal and VDD1 730.

Circuit Block 703 receives data 736 and latches a value in Flip-Flop 704, based on a transition of clock 732. Since data 736 is generated in the VDD1 730 voltage domain and Circuit Block 703 is powered from the VDD2 731 voltage domain, data 736, in a typical system, might pass through a level shifting circuit before being received by Flip-Flop 704. Since, however, Flip-Flop 704 corresponds to one of Flop Circuits 200, 500, or 600, a level shifting circuit is not necessary between Circuit Block 701 and Flip-Flop 704 as Flip-Flop 704 can receive a wide range of input voltage levels. Circuit Block 703 generates output signal data 738 which is in turn, received by Flip-Flop 706 in Circuit Block 705. Although both Circuit Blocks 703 and 705 are in the VDD2 731 voltage domain, Flip-Flop 706 may still correspond to one of Flop Circuits 200, 500, and 600. Flip-Flop 706 latches a value of data 738 based on a transition of clock 732, and generates output signal 740 based on this latched value.

In a scan test mode, scan enable 733 is asserted, and Flip-Flops 702, 704, and 706 disable their respective data input paths and enable their respective scan data input paths. Flip-Flop 702 receives scan data 735 and latches a value of it based on transitions of clock 732. In various embodiments, scan data 735 may be in the VDD1 730 voltage domain, the VDD2 731 voltage domain, or another voltage domain that is not shown in FIG. 7. Since Flip-Flop 702 corresponds to one of Flop Circuits 200, 500, or 600 in the illustrated embodiment, a level shifting circuit is not utilized. Flip-Flop 702 generates the latched data as scan data 737, which is sent to Flip-Flop 704. Flip-Flop 704, similarly, receives scan data 737 without the use of a level shifting circuit and latches a value of scan data 737 based on a transition of clock 732. Flip-Flop 704, in turn, generates scan data 739 which is received by Flip-Flop 706. Flip-Flop 706 generates scan output 741 based on the latched value. Scan output 741 may be sent to additional flip-flop circuits, other circuitry, and/or an output pin to be read by test equipment.

Flip-Flops 702, 704, and 706, in the illustrated embodiment, form at least a portion of a scan chain for testing Circuit 700. Various tests may begin with Circuit 700 in the normal operating mode and switching to scan test mode, or with Circuit 700 in scan test mode and then switching to normal mode, or may be run entirely in scan test mode.

It is noted that the block diagram illustrated in FIG. 7 is merely an example and has been simplified to demonstrate disclosed concepts. In various embodiments, any suitable number of circuit blocks may be included. Additionally, any suitable number of flip-flops may be included in each circuit block.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a first latch circuit including a first discharge node, a second discharge node, a true storage node and a complement storage node, wherein the first latch circuit is configured to pre-charge the true storage node and the complement storage node to a first voltage level using a clock signal;
   a discharge circuit including:
      a first transconductance device located in a first discharge path between the first discharge node and a ground reference; and
      a second transconductance device in a second discharge path between the first discharge node and the ground reference;
   wherein the discharge circuit is configured to:
      in response to a determination that a scan mode signal is asserted, selectively discharge, based on a value of a scan data signal on a gate terminal of the first transconductance device, either the true storage node via the first discharge node, or the complement storage node via the second discharge node, wherein the scan data signal transitions between a ground voltage level and a second voltage level different than the first voltage level;

otherwise selectively discharge, based on a value of a data signal on a gate terminal of the second transconductance device, either the true storage node via the first discharge node, or the complement storage node via the second discharge node, wherein the data signal transitions between the ground voltage level and a third voltage level different than the first and second voltage levels;

a second latch circuit coupled to the first latch circuit, wherein the second latch circuit is configured to store a value of a data bit based on a voltage level of the true storage node and a voltage level of the complement storage node; and at least one logic gate coupled to a respective output node of at least one output node of the second latch circuit, the logic gate configured to block propagation of a respective output signal in response to a determination that the scan mode signal is de-asserted.

2. The apparatus of claim 1, wherein to selectively discharge either the true storage node or the complement storage node based on the value of the data signal, the discharge circuit is further configured to discharge the complement storage node in response to a logic high value on the data signal, otherwise discharge the true storage node.

3. The apparatus of claim 1, wherein to selectively discharge either the true storage node or the complement storage node based on the value of the scan data signal, the discharge circuit is further configured to discharge the complement storage node in response to a logic high value on the scan data signal, otherwise discharge the true storage node.

4. The apparatus of claim 1, wherein to pre-charge the true storage node and the complement storage node to the first voltage level using the clock signal, the first latch circuit is further configured to pre-charge the true storage node and the complement storage node in response to a logic low value on the clock signal.

5. The apparatus of claim 1, wherein the first and second transconductance devices are metal-oxide semiconductor field-effect transistors (MOSFETs).

6. The apparatus of claim 1, wherein the discharge circuit includes a third discharge path including a third transconductance device, and a fourth discharge path including a fourth transconductance device, wherein each of the third and fourth discharge paths are coupled between the second discharge node and the ground reference, wherein the third discharge path is configured to discharge the complement storage node via the second discharge node, based on the scan mode signal and an inverse scan data signal, and wherein fourth discharge path is configured to discharge the complement storage node via the second discharge node, based on an inverse scan mode signal and an inverse input data signal.

7. The apparatus of claim 1, wherein the ground reference is a virtual ground reference and is discharged to a ground reference signal in response to a logic high value on the clock signal.

8. A method directed to a data latching circuit, comprising:

pre-charging, by a first latch circuit, a true storage node and a complement storage node to a first voltage level using a clock signal;

receiving a scan data signal on a gate terminal of a first transconductance device included in a discharge circuit in a first discharge path between a first discharge node and a ground reference, wherein the scan data signal transitions between a voltage level of the ground reference and a second voltage level different than the first voltage level;

receiving a complement scan data signal on a gate terminal of a second transconductance device included in the discharge circuit in a second discharge path between a second discharge node and the ground reference;

receiving a data signal on a gate terminal of a third transconductance device included in the discharge circuit in a third discharge path between the first discharge node and a ground reference, wherein the data signal transitions between the voltage level of the ground reference and a third voltage level different than the first and second voltage levels;

receiving a complement data signal on a gate terminal of a fourth transconductance device included in the discharge circuit in a fourth discharge path between the second discharge node and the ground reference;

in response to determining that, at a particular point in time, a scan mode signal is asserted, selectively discharging, based on values of the scan data signal and the complement scan data signal, either the true storage node via the first discharge node, or the complement storage node via the second discharge node; and storing, by a second latch circuit, a value of a data bit based on a voltage level of the true storage node and a voltage level of the complement storage node.

9. The method of claim 8, further comprising, in response to determining that, at a different point in time, a scan mode signal is de-asserted, selectively discharging based on a value of the data signal and a value of the complement data signal, either the true storage node via the first discharge node, or the complement storage node via the second discharge node.

10. The method of claim 9, wherein selectively discharging either the true storage node or the complement storage node based on the value of the data signal comprises discharging the complement storage node using the fourth discharge path in response to a logic high value on the data signal.

11. The method of claim 9, wherein selectively discharging either the true storage node or the complement storage node based on the value of the data signal comprises discharging the true storage node using the third discharge path in response to a logic high value on an inverse data signal.

12. The method of claim 8, wherein selectively discharging either the true storage node or the complement storage node based on the value of the scan data signal comprises discharging the complement storage node using the second discharge path in response to a logic high value on the scan data signal.

13. The method of claim 8, wherein selectively discharging either the true storage node or the complement storage node based on the value of the scan data signal comprises discharging the true storage node using the first discharge path in response to a logic high value on an inverse scan data signal.

14. The method of claim 8, wherein pre-charging, the true storage node and the complement storage node to the first voltage level using the clock signal, comprises pre-charging the true storage node and the complement storage node in response to a logic low value on the clock signal.

15. A system, comprising:
a first circuit block, coupled to a first power source with a first voltage level, configured to generate a data signal which transitions between a voltage level of a ground reference and the first voltage level;
a second circuit block, coupled to a second power source with a second voltage level, configured to generate a scan data signal which transitions between a voltage level of the ground reference and the second voltage level;
a data latching circuit, coupled to a third power source with a third voltage level, different from the first and second voltage levels, configured to:
pre-charge a true storage node and a complement storage node to the third voltage level using a clock signal;
receive the scan data signal on a gate terminal of a first transconductance device included in the data latching circuit, wherein the first transconductance device is located in a first discharge path between a first discharge node and a ground reference;
receive the data signal on a gate terminal of a second transconductance device included in the data latching circuit, wherein the second transconductance device is located in a second discharge path between the first discharge node and the ground reference;
in response to a determination that a scan mode signal is asserted, selectively discharge, based on a value of the scan data signal, either the true storage node via the first discharge node, or the complement storage node via a second discharge node;
otherwise selectively discharge, based on a value of the data signal, either the true storage node, via the first discharge node, or the complement storage node, via the second discharge node; and
store a value of a data bit based on a voltage level of the true storage node and a voltage level of the complement storage node.

16. The system of claim 15, wherein to selectively discharge either the true storage node or the complement storage node based on the value of the data signal, the data latching circuit is further configured to discharge the complement storage node in response to a logic high value on the data signal, and to otherwise select the true storage node.

17. The system of claim 15, wherein to selectively discharge either the true storage node or the complement storage node based on the value of the scan data signal, the data latching circuit is further configured to discharge the complement storage node in response to a logic high value on the scan data signal, and to otherwise select the true storage node.

18. The system of claim 15, wherein the first and second transconductance devices are metal-oxide semiconductor field-effect transistors (MOSFETs).

19. The system of claim 18, wherein the data latching circuit includes a third discharge path including a third transconductance device and a fourth discharge path including a fourth transconductance device, each coupled between the second discharge node and the ground reference, wherein the third discharge path is configured to discharge the complement storage node via the second discharge node, based on the scan mode signal and an inverse scan data signal, and wherein fourth discharge path is configured to discharge the complement storage node via the second discharge node, based on an inverse scan mode signal and an inverse input data signal.

20. The system of claim 15, wherein the ground reference is a virtual ground reference and is discharged to a ground reference signal in response to a logic high value on the clock signal.

* * * * *